(12) United States Patent
Chen et al.

(10) Patent No.: US 9,419,022 B1
(45) Date of Patent: Aug. 16, 2016

(54) TFT ARRAY SUBSTRATE

(71) Applicant: Shenzhen China Star Optoelectronics Technology Co., Ltd., Shenzhen, Guangdong (CN)

(72) Inventors: Caiqin Chen, Guangdong (CN); Jehao Hsu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 58 days.

(21) Appl. No.: 14/423,758

(22) PCT Filed: Nov. 5, 2014

(86) PCT No.: PCT/CN2014/090284
§ 371 (c)(1),
(2) Date: Feb. 25, 2015

(87) PCT Pub. No.: WO2016/061849
PCT Pub. Date: Apr. 28, 2016

(30) Foreign Application Priority Data

Oct. 22, 2014 (CN) .......................... 2014 1 0568875

(51) Int. Cl.
*H01L 27/12* (2006.01)
*H01L 27/14* (2006.01)
*G09G 3/32* (2016.01)
*G09G 3/36* (2006.01)

(52) U.S. Cl.
CPC ............ *H01L 27/124* (2013.01); *G09G 3/3266* (2013.01); *G09G 3/3275* (2013.01); *G09G 3/3677* (2013.01); *G09G 3/3688* (2013.01); *G09G 2300/0809* (2013.01); *G09G 2310/0278* (2013.01)

(58) Field of Classification Search
CPC .. H01L 27/124; H01L 27/156; H01L 27/3216
USPC ................................................ 257/59–60, 72
See application file for complete search history.

(56) References Cited

U.S. PATENT DOCUMENTS

| | | | | |
|---|---|---|---|---|
| 9,123,591 B2* | 9/2015 | Chen | ..................... | H01L 27/156 |
| 9,217,905 B2* | 12/2015 | Xia | ..................... | G09G 3/3648 |
| 9,263,474 B2* | 2/2016 | Choi | ..................... | H01L 27/124 |
| 2013/0135183 A1* | 5/2013 | Kimura | ............... | H01L 27/3216 345/76 |

* cited by examiner

*Primary Examiner* — Cuong Q Nguyen
(74) *Attorney, Agent, or Firm* — Andrew C. Cheng

(57) ABSTRACT

The present invention provides a thin-film transistor (TFT) array substrate. The TFT array substrate is structured to change the way that sub-pixels are arranged so that during a displaying period of a frame of image, the sub-pixels that have inconsistent brightness/darkness become alternate with each other spatially so that a displaying defect of vertical bright/dark lines can be improved and the overall resistance of the data line can be reduced to thereby reduce resistance-capacitance delay and prevent incorrect charging at a tail end of a scan line or a data line.

7 Claims, 7 Drawing Sheets

TFT ARRAY SUBSTRATE

BACKGROUND OF THE INVENTION

1. Field of the Invention

The present invention relates to the field of displaying technology, and in particular to a TFT (Thin-Film Transistor) array substrate.

2. The Related Arts

In the field of displaying technology, flat panel displays, such as liquid crystal displays (LCDs) and organic light-emitting diodes (OLEDs) have gradually taken the place of cathode ray tube (CRT) displays for wide applications in liquid crystal televisions, mobile phones, personal digital assistants (PDAs), digital cameras, computer monitors, and notebook computer screens.

A display panel is a major component of the LCDs and OLEDs. Both the LCD display panels and the OLED display panels comprise a thin-film transistor (TFT) array substrate. The TFT array substrate comprises a plurality of red (R), green (G), and blue (B) sub-pixels arranged in an array and a plurality of scan lines and a plurality of data lines. Each of the sub-pixels receives a scan signal from a corresponding scan line and a data signal from a corresponding data line in order to display an image.

FIG. 1 is a schematic view showing a conventional TFT array substrate. The conventional TFT array substrate comprises a plurality of vertical data lines that is arranged in order and parallel to each other, such as D1, D2, D3, D4, D5 and so on, and a plurality of horizontal scan line that is arranged in order and parallel to each other, such as G1, G2, G3, G4, G5 and so on, and sub-pixels that are arranged in an array. The sub-pixels that are arranged on the same row are each electrically connected via a TFT to the scan line located above the row of sub-pixels. For example, each of the sub-pixels that constitute a first row is electrically connected via a TFT to the scan line G1; each of the sub-pixels that constitute a second row is electrically connected via a TFT to the scan line G2; and so on. The sub-pixels that are arranged on the same column is electrically connected via a TFT to the data line located leftward of the column of sub-pixels. For example, each of the sub-pixels that constitute a first column is electrically connected via a TFT to the data line D1; each of the sub-pixels that constitute a second column is electrically connected via a TFT to the data line D2; and so on.

FIG. 2 is a schematic view showing a conventional data line share (DLS) TFT array substrate. The DLS TFT array substrate comprises data lines each corresponding two columns of sub-pixels and two scan lines respectively arranged above and below each row of sub-pixels. For sub-pixels of each row, a sub-pixel of an even column and a sub-pixel of an odd-column that are respectively located on left and right sides of each data line are each electrically connected by a TFT to the data line, namely sharing the same data line. Also, for sub-pixels of each row, each of the sub-pixels of even columns is electrically connected by a TFT to the scan line above the row of the sub-pixels and each of the sub-pixels of odd columns is electrically connected by a TFT to the scan line below the row of the sub-pixels. For example, a second row and a third row of sub-pixels share the data line D2; a fourth row and a fifth row of sub-pixels share data line D3, and so on. Each of the sub-pixels of the first row that are in even columns is electrically connected by a TFT to the scan line G1 above the first row of sub-pixels and each of the sub-pixels of the first row that are in odd columns is electrically connected by a TFT to the scan line G2 below the first row of sub-pixels; each of the sub-pixels of the second row that are in even columns is electrically connected by a TFT to the scan line G3 above the second row of sub-pixels and each of the sub-pixels of the second row that are in odd columns is electrically connected by a TFT to the scan line G4 below the second row of sub-pixels, and so on. Compared to the traditional TFT array substrate shown in FIG. 1, the DLS TFT array substrate allows for reduction of the number of data lines by half and thus reduction of the cost; however, the number of scan lines is doubled so that the charging time that each sub-pixel may have is reduced by half due to the doubled number of scan lines and thus delays of signals in the corresponding data lines and scan lines would be more prominent. For example, at a tail end of a data line (or a scan line), the delay in the data line (or the scan line) could cause difference in charging rates between sub-pixels of the odd row and the sub-pixel of the even rows, and consequently, display defects of vertical bright and dark lines may result.

Specifically, reference is now made collectively to FIGS. 2, 3, and 4. As shown in FIG. 4, the manner of driving data lines is that polarity is reversed for every two dots. Due to RC delay, the data signals are not ideal square waves and the wave forms of the actual signals are wave forms with curved edges as shown in FIG. 3. For a specific sub-pixel Pxy, where x indicates the x-th row and y indicates the y-th column, such as sub-pixel P12 shown in FIG. 2 indicating a sub-pixel of the second column in the first row, when scan lines G1, G2, G3, and G4 are sequentially conducted on, the odd-column sub-pixels that are connected a data line are sequentially driven earlier than the odd-column sub-pixels. For example, sub-pixels P12, P13, P22, P23 that are connected to the data line D2 are driven in that sequence. In the period of the same polarity of the data signal, the sub-pixel that is driven later is better charged than that driven earlier. As such, P13 is better charged than P12 and P23 is better charged than P22. After the reverse of polarity of the data signal, the driving sequence maintains the same, namely the odd-column sub-pixels are driven first and then the odd-column sub-pixels are driven. As such, the even-column sub-pixels that are driven first may suffer being insufficiently charged so that the site corresponding to the even-column sub-pixels become insufficiently bright, making the overall displaying effect showing a defect of vertical bright and dark lines.

SUMMARY OF THE INVENTION

An object of the present invention is to provide a thin-film transistor (TFT) array substrate, wherein within a displaying period of a frame of image, the sub-pixels that have inconsistent brightness/darkness are alternate with each other spatially so that a displaying defect of vertical bright/dark lines is improved and since the overall resistance of a data line is reduced, resistance-capacitance delay is reduced so as to prevent incorrect charging at a tail end of a scan line or a data line.

To achieve the above object, the present invention provides a TFT array substrate, which comprises: a plurality of data lines, a plurality of scan lines, and a plurality of sub-pixels arranged in an array;

in each row of the sub-pixels, the sub-pixels of odd columns and the sub-pixels of even columns being staggered laterally on a plane;

each of the data lines being electrically connected to two sub-pixels of each of the sub-pixel rows that are located on left side and right side of the data line respectively by TFTs and supplying data signals to the two sub-pixels;

two scan lines being provided, corresponding to and located at upper and lower sides of each of the sub-pixel rows; the nth scan line and the (n')th scan line being respectively located on the upper and lower sides of the nth sub-pixel row; the (n+1)th scan line and the (n'+1)th scan line being respectively located on the upper and lower sides of the (n+1)th sub-pixel row, n being a positive integer, so that the nth sub-pixel row and the (n+1)th sub-pixel row collectively form a repeatable circuit formation unit;

the nth scan line being electrically connected via TFTs to and driving the sub-pixels of even columns in the nth sub-pixel row and the (n')th scan line being electrically connected via TFTs to and driving the sub-pixels of odd columns in the nth sub-pixel row; and the (n+1)th scan line being electrically connected via TFTs to and driving the sub-pixels of odd columns in the (n+1)th sub-pixel row and the (n'+1)th scan line being electrically connected via TFTs to and driving the sub-pixels of even columns in the (n+1)th sub-pixel row; whereby in the nth sub-pixel row, the sub-pixels of even columns are driven earlier than the sub-pixels of odd columns and in the (n+1)th sub-pixel row, the sub-pixels of even columns are driven later than the sub-pixels of odd columns.

The data lines are driven in a manner of reversing polarity for every two dots.

During a display period of a frame of image, in each row of the sub-pixels, the nth sub-pixel row and the (n+1)th sub-pixel row show an arrangement of alternating darkness and brightness.

A TFT array substrate comprises: a plurality of data lines, a plurality of scan lines, and a plurality of sub-pixels arranged in an array;

in each row of the sub-pixels, the sub-pixels of odd columns and the sub-pixels of even columns being staggered laterally on a plane;

each of the data lines being electrically connected to two sub-pixels of each of the sub-pixel rows that are located on left side and right side of the data line respectively by TFTs and supplying data signals to the two sub-pixels;

two scan lines being provided, corresponding to and located at upper and lower sides of each sub-pixel row; the nth scan line and the (n')th scan line being respectively located on the upper and lower sides of the nth sub-pixel row; the (n+1)th scan line and the (n'+1)th scan line being respectively located on the upper and lower sides of the (n+1)th sub-pixel row; the (n+2)th scan line and the (n'+2)th scan line being respectively located on the upper and lower sides of the (n+2)th sub-pixel row; and the (n+3)th scan line and the (n'+3)th scan line being respectively located on the upper and lower sides of the (n+3)th sub-pixel row, n being a positive integer, so that the nth sub-pixel row, the (n+1)th sub-pixel row, the (n+2)th sub-pixel row, and the (n+3)th sub-pixel row collectively form a repeatable circuit formation unit;

the nth scan line being electrically connected via TFTs to and driving the sub-pixels of even columns in the nth sub-pixel row and the (n')th scan line being electrically connected via TFTs to and driving the sub-pixels of odd columns in the nth sub-pixel row; the (n+1)th scan line being electrically connected via TFTs to and driving the sub-pixels of even columns in the (n+1)th sub-pixel row and the (n'+1)th scan line being electrically connected via TFTs to and driving the sub-pixels of odd columns in the (n+1)th sub-pixel row; the (n+2)th scan line being electrically connected via TFTs to and driving the (n+2)th the sub-pixels of odd columns in sub-pixel row and the (n'+2)th scan line being electrically connected via TFTs to and driving the sub-pixels of even columns of the (n+2)th sub-pixel row; and the (n+3)th scan line being electrically connected via TFTs to and driving the sub-pixels of odd columns of the (n+3)th sub-pixel row and the (n'+3)th scan line being electrically connected via TFTs to and driving the sub-pixels of even columns of the (n+3)th sub-pixel row; whereby in the nth and (n+1)th sub-pixel rows, the sub-pixels of even columns are driven earlier than the sub-pixels of odd columns; and in the (n+2)th and (n+3)th sub-pixel rows, the sub-pixels of even columns are driven later than the sub-pixels of odd columns.

The data lines are driven in a manner of reversing polarity for every two dots.

During a display period of a frame of image, in each row of the sub-pixels, the nth and (n+1)th sub-pixel rows and the (n+2)th and (n+3)th sub-pixel rows show an arrangement of alternating darkness and brightness.

The efficacy of the present invention is that the present invention provides a TFT array substrate, which changes the way that sub-pixels are arranged so that during a displaying period of a frame of image, the sub-pixels that have inconsistent brightness/darkness become alternate with each other spatially so that a displaying defect of vertical bright/dark lines can be improved and the overall resistance of the data line can be reduced to thereby reduce resistance-capacitance delay and prevent incorrect charging at a tail end of a scan line or a data line.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
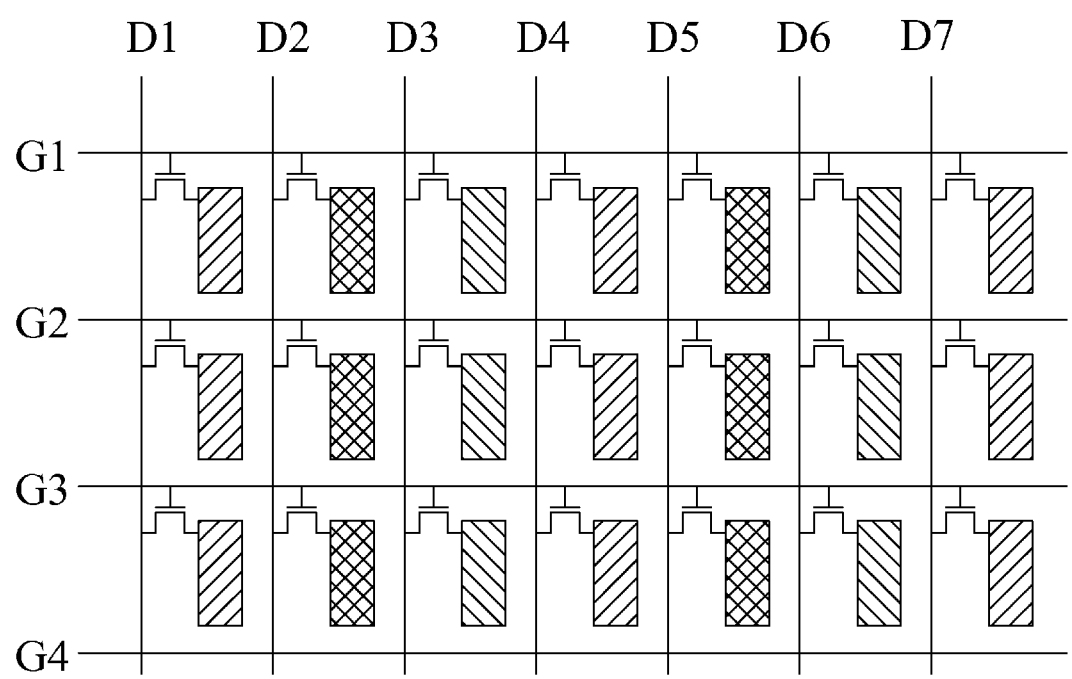
FIG. 1 is a schematic view showing a structure of a conventional thin-film transistor (TFT) array substrate.
Figure 2:
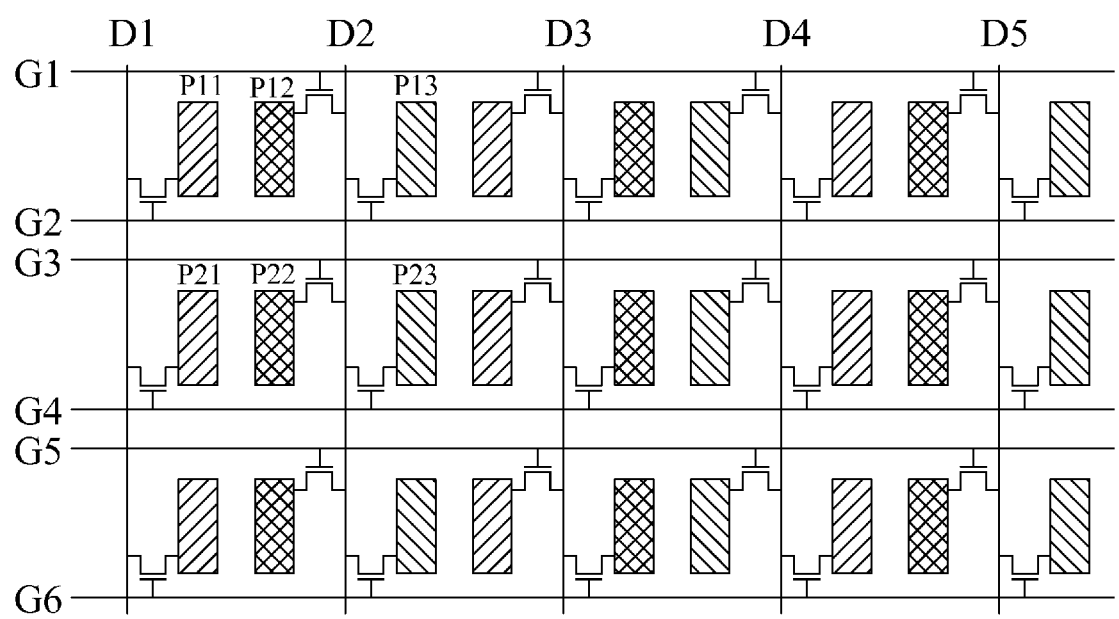
FIG. 2 is a schematic view showing a structure of a conventional data line share (DLS) TFT array substrate.
Figure 3:
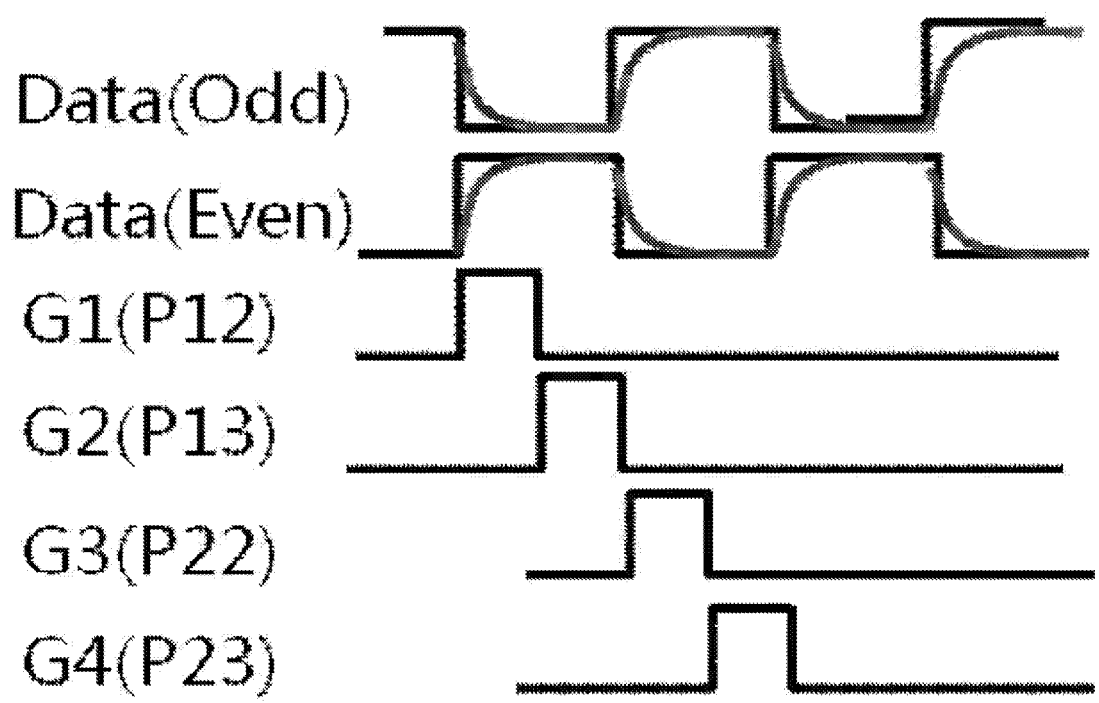
FIG. 3 is a view illustrating wave forms of data signals of FIG. 2.
Figure 4:
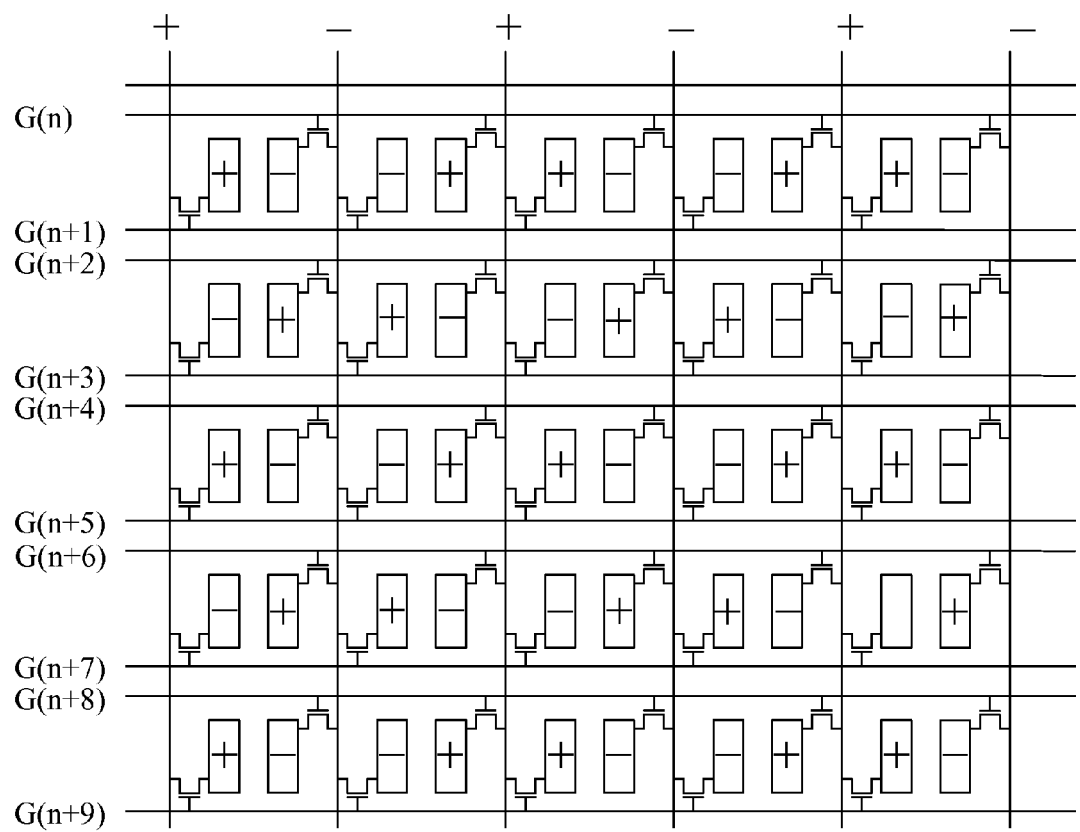
FIG. 4 is a schematic view illustrating two dots polarity reverse for a data line driving method of the DLS TFT array substrate.
Figure 5:
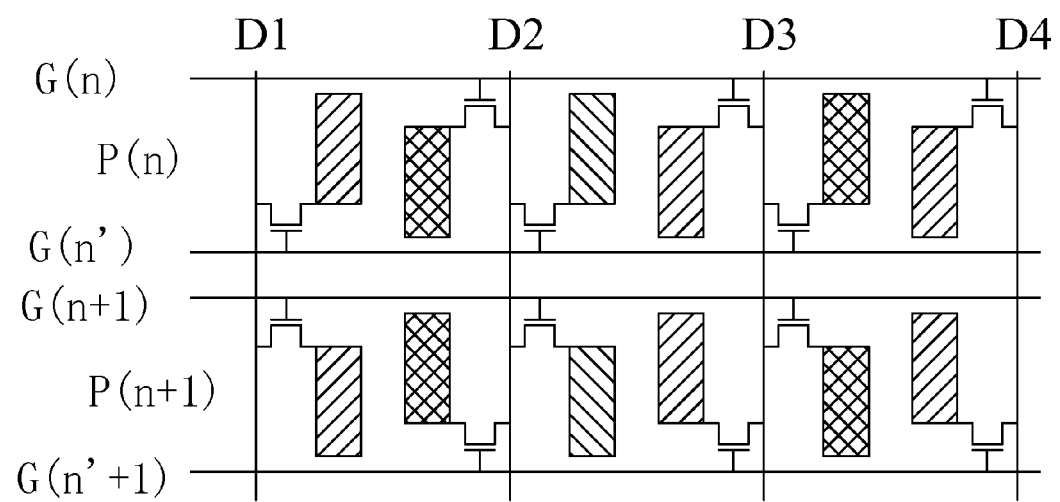
FIG. 5 is a schematic view showing a TFT array substrate according to a first embodiment of the present invention.

Referring to FIG. 5, a schematic view is given to illustrate a thin-film transistor (TFT array substrate) according to a first embodiment of the present invention. The TFT array substrate comprises: a plurality of data lines, such as D1, D2, D3, D4, a plurality of scan lines, and a plurality of sub-pixels arranged in an array.

In each row of the sub-pixels, the sub-pixels of odd columns and the sub-pixels of even columns are staggered laterally on a plane.

Each of the data lines is electrically connected to two sub-pixels of each sub-pixel row that are located on left side and right side of the data line respectively by TFTs and supplies data signals to the two sub-pixels.

Two scan lines are provided, corresponding to and located at upper and lower sides of each sub-pixel row. The nth scan line G(n) and the (n')th scan line G(n') are respectively located on the upper and lower sides of the nth sub-pixel row P(n); the (n+1)th scan line G(n+1) and the (n'+1)th scan line G(n'+1) are respectively located on the upper and lower sides of the (n+1)th sub-pixel row P(n+1), n being a positive integer, so that the nth sub-pixel row P(n) and the (n+1)th sub-pixel row P(n+1) collectively form a repeatable circuit formation unit, namely the entirety of a circuit being formed by repeatedly arranging the circuit formation unit. For example, the first sub-pixel row and the second sub-pixel row form a circuit formation unit and the third and fourth sub-pixel rows form a repeatable circuit formation unit, and so on.

The nth scan line G(n) is electrically connected via TFTs to and drives the sub-pixels of even columns in the nth sub-pixel row P(n) and the (n')th scan line G(n') is electrically connected via TFTs to and drives the sub-pixels of odd columns in the nth sub-pixel row P(n); and the (n+1)th scan line G(n+1) is electrically connected via TFTs to and drives the sub-pixels of odd columns in the (n+1)th sub-pixel row P(n+1) and the (n'+1)th scan line G(n'+1) is electrically connected via TFTs to and drives the sub-pixels of even columns in the (n+1)th sub-pixel row P(n+1).

When the scan lines are sequentially turned on from top to bottom, the sub-pixels of even columns in the nth sub-pixel row P(n) are driven earlier than the sub-pixels of odd columns so that the sub-pixels of odd columns of the nth sub-pixel row are provided with a better effect of charging than the sub-pixels of even columns, whereby the sub-pixels of odd columns in the nth sub-pixel row become brighter while the sub-pixels of even columns are darker; and in the (n+1)th sub-pixel row P(n+1), the sub-pixels of even columns are driven later than the sub-pixels of odd columns so that the sub-pixels of even columns of the (n+1)th sub-pixel row are provided with a better effect of charging than the sub-pixels of odd columns, whereby the sub-pixels of odd columns in the (n+1)th sub-pixel row become darker while the sub-pixels of even columns are brighter.

Figure 7:
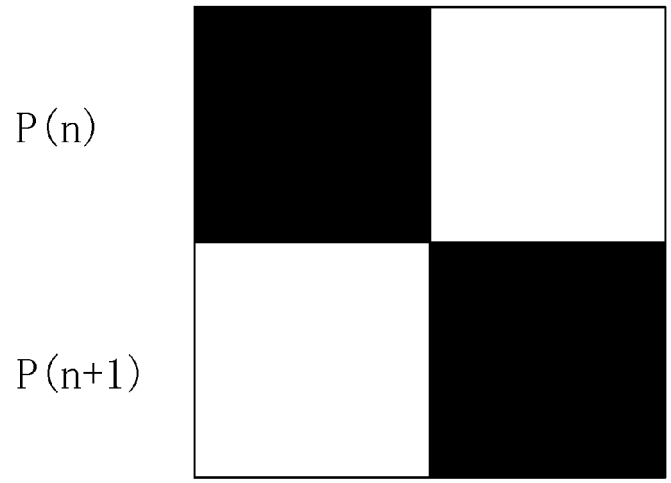
FIG. 7 is a schematic view illustrating the distribution of brightness and darkness of sub-pixels of the TFT array substrate according to the first embodiment of the present invention.

The data lines are driven in a manner of reversing polarity for every two dots. After the reverse of polarity of the data signals, the driving sequence remains unchanged so that eventually, during the displaying period of a frame of image, in each row of the sub-pixels, the nth sub-pixel row P(n) and the (n+1)th sub-pixel row P(n+1) show an arrangement of alternating "dark" and "bright", as shown in FIG. 7. In view of the overall displaying effect, the sub-pixels that have inconsistent brightness/darkness become alternate with each other spatially so that a displaying defect of vertical bright/dark lines can be improved. Further, the overall resistance of the data line can be reduced to thereby reduce resistance-capacitance delay and prevent incorrect charging at a tail end of a scan line or a data line.

Figure 6:
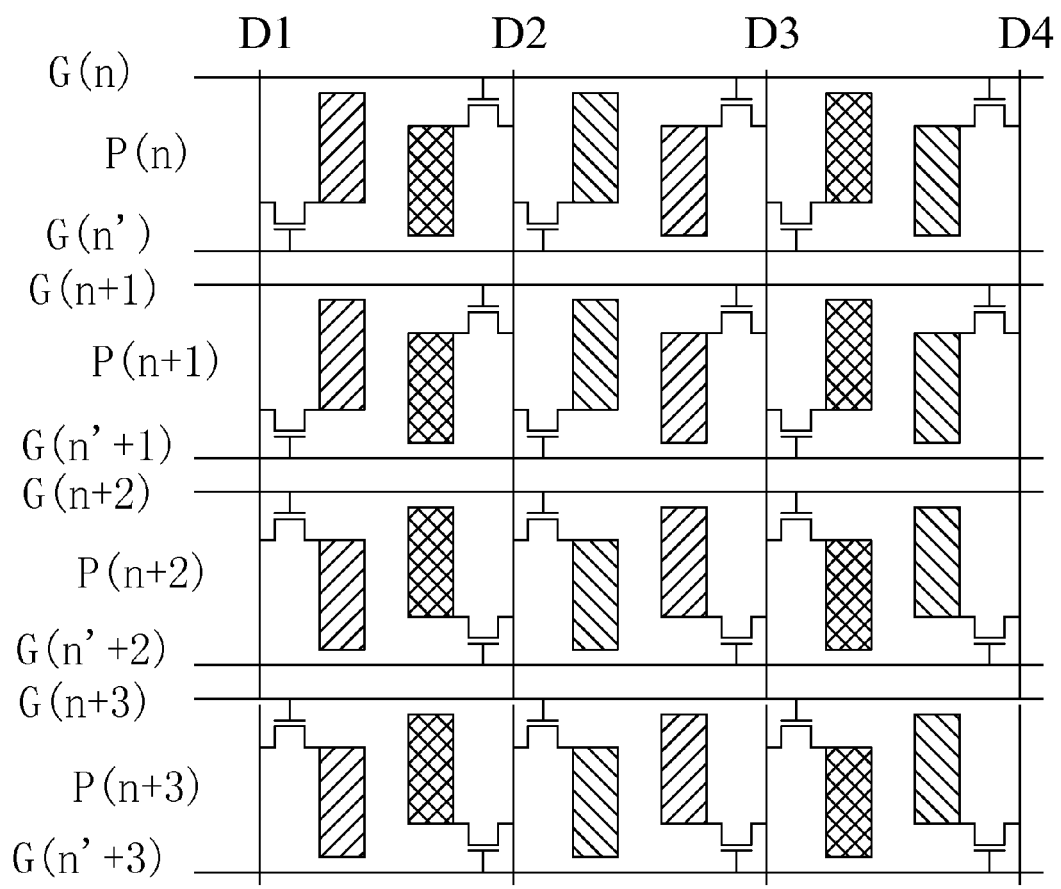
FIG. 6 is a schematic view showing a TFT array substrate according to a second embodiment of the present invention.

Referring to FIG. 6, a schematic view is given to illustrate a TFT array substrate according to a second embodiment of the present invention. The TFT array substrate comprises: a plurality of data lines, a plurality of scan lines, and a plurality of sub-pixels arranged in an array.

In each row of the sub-pixels, the sub-pixels of odd columns and the sub-pixels of even columns are staggered laterally on a plane.

Each of the data lines is electrically connected to two sub-pixels of each sub-pixel row that are located on left side and right side of the data line respectively by TFTs and supplies data signals to the two sub-pixels.

Two scan lines are provided, corresponding to and located at upper and lower sides of each sub-pixel row. The nth scan line G(n) and the (n')th scan line G(n') are respectively located on the upper and lower sides of the nth sub-pixel row P(n); the (n+1)th scan line G(n+1) and the (n'+1)th scan line G(n'+1) are respectively located on the upper and lower sides of the (n+1)th sub-pixel row P(n+1); the (n+2)th scan line G(n+2) and the (n'+2)th scan line G(n'+2) are respectively located on the upper and lower sides of the (n+2)th sub-pixel row P(n+2); and the (n+3)th scan line G(n+3) and the (n'+3)th scan line G(n'+3) are respectively located on the upper and lower sides of the (n+3)th sub-pixel row P(n+3), n being a positive integer, so that the nth sub-pixel row P(n), the (n+1)th sub-pixel row P(n+1), the (n+2)th sub-pixel row P(n+2), and the (n+3)th sub-pixel row P(n+3) collectively form a repeatable circuit formation unit, namely the entirety of a circuit being formed by repeatedly arranging the circuit formation unit. For example, the first, second, third, and fourth sub-pixel rows form a circuit formation unit and the fifth, sixth, seventh, and eighth sub-pixel rows form a repeatable circuit formation unit, and so on.

The nth scan line G(n) is electrically connected via TFTs to and drives the sub-pixels of even columns in the nth sub-pixel row P(n) and the (n')th scan line G(n') is electrically connected via TFTs to and drives the sub-pixels of odd columns in the nth sub-pixel row P(n); the (n+1)th scan line G(n+1) is electrically connected via TFTs to and drives the sub-pixels of even columns in the (n+1)th sub-pixel row P(n+1) and the (n'+1)th scan line G(n'+1) is electrically connected via TFTs to and drives the sub-pixels of odd columns in the (n+1)th sub-pixel row P(n+1); the (n+2)th scan line G(n+2) is electrically connected via TFTs to and drives the (n+2)th the sub-pixels of odd columns in sub-pixel row P(n+2) and the (n'+2)th scan line G(n'+2) is electrically connected via TFTs to and drives the sub-pixels of even columns of the (n+2)th sub-pixel row P(n+2); and the (n+3)th scan line G(n+3) is electrically connected via TFTs to and drives the sub-pixels of odd columns of the (n+3)th sub-pixel row P(n+3) and the (n'+3)th scan line G(n'+3) is electrically connected via TFTs to and drives the sub-pixels of even columns of the (n+3)th sub-pixel row P(n+3).

When the scan lines are sequentially turned on from top to bottom, the sub-pixels of even columns in the nth and (n+1)th sub-pixel rows P(n), P(n+1) are driven earlier than the sub-pixels of odd columns so that the sub-pixels of odd columns of the nth and (n+1)th sub-pixel rows are provided with a better effect of charging than the sub-pixels of even columns, whereby the sub-pixels of odd columns in the nth and (n+1)th sub-pixel rows become brighter while the sub-pixels of even columns are darker; and in the (n+2)th and (n+3)th sub-pixel rows P(n+2), P(n+3), the sub-pixels of even columns are driven later than the sub-pixels of odd columns so that the sub-pixels of even columns of the (n+2)th and (n+3)th sub-pixel rows are provided with a better effect of charging than the sub-pixels of odd columns, whereby the sub-pixels of odd columns in the (n+2)th and (n+3)th sub-pixel rows become darker while the sub-pixels of even columns are brighter.

Figure 8:
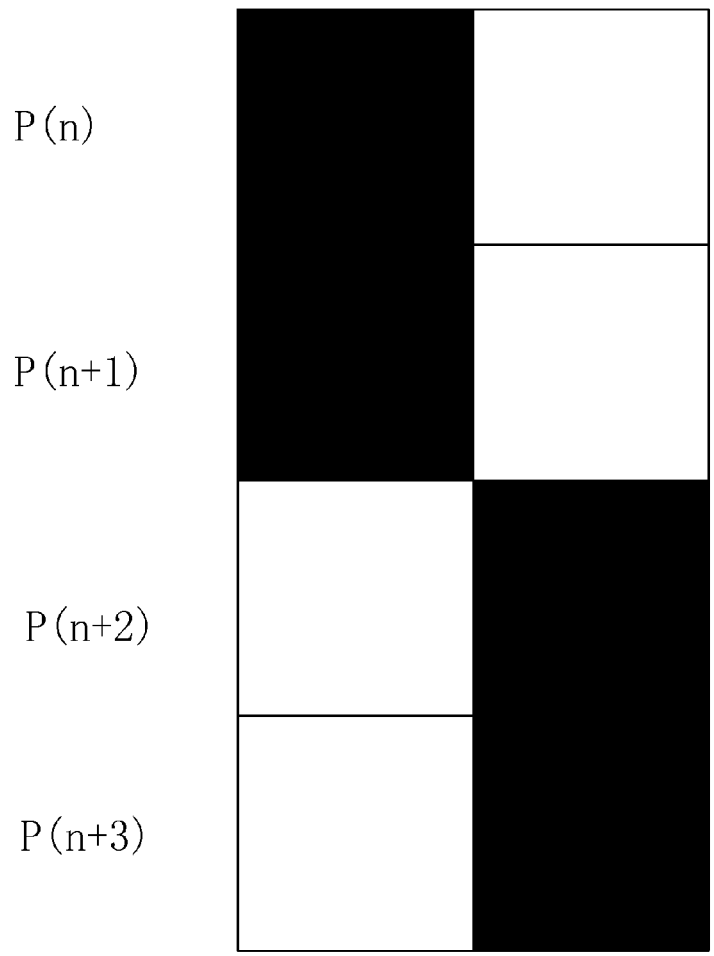
FIG. 8 is a schematic view illustrating the distribution of brightness and darkness of sub-pixels of the TFT array substrate according to the second embodiment of the present invention.

The data lines are driven in a manner of reversing polarity for every two dots. After the reverse of polarity of the data signals, the driving sequence remains unchanged so that eventually, during the displaying period of a frame of image, the nth and (n+1)th sub-pixel rows P(n), P(n+1) and the (n+2)th and (n+3)th sub-pixel rows P(n+2), P(n+3) show an arrangement of alternating "dark" and "bright", as shown in FIG. 8. In view of the overall displaying effect, the sub-pixels that have inconsistent brightness/darkness become alternate with each other spatially so that a displaying defect of vertical bright/dark lines can be improved. Further, the overall resistance of the data line can be reduced to thereby reduce resistance-capacitance delay and prevent incorrect charging at a tail end of a scan line or a data line.

In summary, the present invention provides a TFT array substrate, which changes the way that sub-pixels are arranged so that during a displaying period of a frame of image, the sub-pixels that have inconsistent brightness/darkness become alternate with each other spatially so that a displaying defect of vertical bright/dark lines can be improved and the overall resistance of the data line can be reduced to thereby reduce resistance-capacitance delay and prevent incorrect charging at a tail end of a scan line or a data line.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A thin-film transistor (TFT) array substrate, comprising: a plurality of data lines, a plurality of scan lines, and a plurality of sub-pixels arranged in an array;

in each row of the sub-pixels, the sub-pixels of odd columns and the sub-pixels of even columns being staggered laterally on a plane;

each of the data lines being electrically connected to two sub-pixels of each of the sub-pixel rows that are located on left side and right side of the data line respectively by TFTs and supplying data signals to the two sub-pixels;

two scan lines being provided, corresponding to and located at upper and lower sides of each of the sub-pixel rows; the nth scan line and the (n')th scan line being respectively located on the upper and lower sides of the nth sub-pixel row; the (n+1)th scan line and the (n'+1)th scan line being respectively located on the upper and lower sides of the (n+1)th sub-pixel row, n being a positive integer, so that the nth sub-pixel row and the (n+1)th sub-pixel row collectively form a repeatable circuit formation unit;

the nth scan line being electrically connected via TFTs to and driving the sub-pixels of even columns in the nth sub-pixel row and the (n')th scan line being electrically connected via TFTs to and driving the sub-pixels of odd columns in the nth sub-pixel row; and the (n+1)th scan line being electrically connected via TFTs to and driving the sub-pixels of odd columns in the (n+1)th sub-pixel row and the (n'+1)th scan line being electrically connected via TFTs to and driving the sub-pixels of even columns in the (n+1)th sub-pixel row; whereby in the nth sub-pixel row, the sub-pixels of even columns are driven earlier than the sub-pixels of odd columns and in the (n+1)th sub-pixel row, the sub-pixels of even columns are driven later than the sub-pixels of odd columns.

2. The TFT array substrate as claimed in claim 1, wherein the data lines are driven in a manner of reversing polarity for every two dots.

3. The TFT array substrate as claimed in claim 1, wherein during a display period of a frame of image, in each row of the sub-pixels, the nth sub-pixel row and the (n+1)th sub-pixel row show an arrangement of alternating darkness and brightness.

4. A thin-film transistor (TFT) array substrate, comprising: a plurality of data lines, a plurality of scan lines, and a plurality of sub-pixels arranged in an array;

in each row of the sub-pixels, the sub-pixels of odd columns and the sub-pixels of even columns being staggered laterally on a plane;

each of the data lines being electrically connected to two sub-pixels of each of the sub-pixel rows that are located on left side and right side of the data line respectively by TFTs and supplying data signals to the two sub-pixels;

two scan lines being provided, corresponding to and located at upper and lower sides of each sub-pixel row; the nth scan line and the (n')th scan line being respectively located on the upper and lower sides of the nth sub-pixel row; the (n+1)th scan line and the (n'+1)th scan line being respectively located on the upper and lower sides of the (n+1)th sub-pixel row; the (n+2)th scan line and the (n'+2)th scan line being respectively located on the upper and lower sides of the (n+2)th sub-pixel row; and the (n+3)th scan line and the (n'+3)th scan line being respectively located on the upper and lower sides of the (n+3)th sub-pixel row, n being a positive integer, so that the nth sub-pixel row, the (n+1)th sub-pixel row, the (n+2)th sub-pixel row, and the (n+3)th sub-pixel row collectively form a repeatable circuit formation unit;

the nth scan line being electrically connected via TFTs to and driving the sub-pixels of even columns in the nth sub-pixel row and the (n')th scan line being electrically connected via TFTs to and driving the sub-pixels of odd columns in the nth sub-pixel row; the (n+1)th scan line being electrically connected via TFTs to and driving the sub-pixels of even columns in the (n+1)th sub-pixel row and the (n'+1)th scan line being electrically connected via TFTs to and driving the sub-pixels of odd columns in the (n+1)th sub-pixel row; the (n+2)th scan line being electrically connected via TFTs to and driving the (n+2)th the sub-pixels of odd columns in sub-pixel row and the (n'+2)th scan line being electrically connected via TFTs to and driving the sub-pixels of even columns of the (n+2)th sub-pixel row; and the (n+3)th scan line being electrically connected via TFTs to and driving the sub-pixels of odd columns of the (n+3)th sub-pixel row and the (n'+3)th scan line being electrically connected via TFTs to and driving the sub-pixels of even columns of the (n+3)th sub-pixel row; whereby in the nth and (n+1)th sub-pixel rows, the sub-pixels of even columns are driven earlier than the sub-pixels of odd columns; and in the (n+2)th and (n+3)th sub-pixel rows, the sub-pixels of even columns are driven later than the sub-pixels of odd columns.

5. The TFT array substrate as claimed in claim 4, wherein the data lines are driven in a manner of reversing polarity for every two dots.

6. The TFT array substrate as claimed in claim 4, wherein during a display period of a frame of image, in each row of the sub-pixels, the nth and (n+1)th sub-pixel rows and the (n+2)th and (n+3)th sub-pixel rows show an arrangement of alternating darkness and brightness.

7. A thin-film transistor (TFT) array substrate, comprising: a plurality of data lines, a plurality of scan lines, and a plurality of sub-pixels arranged in an array;

in each row of the sub-pixels, the sub-pixels of odd columns and the sub-pixels of even columns being staggered laterally on a plane;

each of the data lines being electrically connected to two sub-pixels of each of the sub-pixel rows that are located on left side and right side of the data line respectively by TFTs and supplying data signals to the two sub-pixels;

two scan lines being provided, corresponding to and located at upper and lower sides of each of the sub-pixel rows; the nth scan line and the (n')th scan line being respectively located on the upper and lower sides of the nth sub-pixel row; the (n+1)th scan line and the (n'+1)th scan line being respectively located on the upper and lower sides of the (n+1)th sub-pixel row, n being a positive integer, so that the nth sub-pixel row and the (n+1)th sub-pixel row collectively form a repeatable circuit formation unit;

the nth scan line being electrically connected via TFTs to and driving the sub-pixels of even columns in the nth sub-pixel row and the (n')th scan line being electrically connected via TFTs to and driving the sub-pixels of odd columns in the nth sub-pixel row; and the (n+1)th scan line being electrically connected via TFTs to and driving the sub-pixels of odd columns in the (n+1)th sub-pixel row and the (n'+1)th scan line being electrically connected via TFTs to and driving the sub-pixels of even columns in the (n+1)th sub-pixel row; whereby in the nth sub-pixel row, the sub-pixels of even columns are driven earlier than the sub-pixels of odd columns and in the (n+1)th sub-pixel row, the sub-pixels of even columns are driven later than the sub-pixels of odd columns;

wherein the data line are driven in a manner of reversing polarity for every two dots; and wherein during a display period of a frame of image, in each row of the sub-pixels, the nth sub-pixel row and the (n+1)th sub-pixel row show an arrangement of alternating darkness and brightness.

\* \* \* \* \*